United States Patent [19]

Lindmayer

[11] 4,097,310
[45] Jun. 27, 1978

[54] METHOD OF FORMING SILICON SOLAR ENERGY CELLS

[76] Inventor: Joseph Lindmayer, 6919 Blaisdell Rd., Bethesda, Md. 20034

[21] Appl. No.: 807,299

[22] Filed: Jun. 16, 1977

Related U.S. Application Data

[63] Continuation of Ser. No. 583,274, Jun. 3, 1975, abandoned.

[51] Int. Cl.² ................................ H01L 31/00
[52] U.S. Cl. .................... 136/89 SG; 29/572; 29/583; 357/30
[58] Field of Search ............ 29/572, 583; 136/89 SG; 357/30

[56] References Cited

U.S. PATENT DOCUMENTS

| | | | |
|---|---|---|---|
| 3,341,937 | 9/1967 | Dill | 29/583 |
| 3,422,527 | 1/1969 | Gault | 29/583 |
| 3,624,677 | 11/1971 | Pearson | 29/583 |

*Primary Examiner*—W. Tupman

[57] ABSTRACT

A method of forming a silicon solar energy cell, which comprises forming an electron generating junction on a single crystal silicon wafer and thereafter using a saw having a diamond blade to cut through the wafer and the junction formed therein.

6 Claims, No Drawings

METHOD OF FORMING SILICON SOLAR ENERGY CELLS

This is a continuation, of application Ser. No. 583,274, filed June 3, 1975, now abandoned.

BACKGROUND OF THE INVENTION

Solar cells are being utilized to convert light into electricity, the conversion being accomplished by using photons passing through a semiconductor to release electrons and holes, which are then separated by means of an electric field in the semiconductor material. Such solar cells have been known for many years and are often formed from wafers of single crystal silicon. The silicon single crystal wafers are themselves fabricated from silicon single crystal ingots produced by known techniques.

Silicon single crystal ingots are usually round or close to round in shape. In some cases, silicon solar cells are produced by slicing this ingot into circular wafers; in many instances, however, solar cells are required to be of rectangular shape, or of a shape in which their boundaries are straight lines rather than circular or quasi-circular lines. Straight lines are especially desirable when it is desired to pack the silicon wafers. It is a usual procedure that solar cells, having linear perimeters, e.g., in closely adjacent relationship or hexagonal, are produced by trimming the ingot to the proper shape cutting off the excess material on its circumference, and then slicing the ingot into individual wafers, which are manufactured into solar cells. The trimming of the ingot is usually performed by either a diamond saw or by other means utilized for slicing the ingots. The slicing of the ingots is generally performed either by a diamond saw, which may be either an I.D. or an O.D. saw, or by a multiple blade oscillating saw.

Another known process of producing solar cells of other than round shape is to form substantially round slices and chemically etch the boundaries of the wafer, either etching through the entire wafer or only through part of it, then cracking the wafers at the partially etched regions.

There are several other known ways to trim or cut wafers of single crystal silicon. These modes have been used in the semiconductor industry for making transistors or integrated circuits or other semiconductor devices. In that industry wafers are scribed with a diamond or other hard tipped tool and then broken, or scribed or cut with a diamond wheel, or scribed or cut with a laser beam, or just broken along a crystal plane.

While scribing and breaking or cutting of semiconductor wafers are common techniques in the semiconductor art, there is a major difference in principle between subdividing semiconductor wafers to produce integrated circuits, transistors, diodes, and the like, and subdividing them to produce solar cells. In manufacturing transistors or integrated circuits, or other semiconductor devices except solar cells, many individual transistors, for example, are produced on a part of a silicon wafer. Spaces are provided between the transistors, the spaces purposely having no component or junction on them. The dicing or cutting of a wafer is always performed in the spaces between the individual components. In this way no harm is done to the component, since it is isolated from the area where the damage is most likely to occur due to the scribing, cutting or other mechanical abuse. Solar cells could be cut or sliced or diced in a similar manner during the manufacturing process if areas were provided on the wafer where no active part of the solar cell exists. In solar cells the active area is the junction, which is very close to the surface of the device and it extends only several thousand Angstroms downward from the surface. This junction is the vital zone where the efficiency and usefulness of the device are characterized. If this junction is damaged, the cell efficiency is drastically reduced. It has, therefore, been required that solar cells be formed into the desired size and shape before the junction is formed.

Contrary to past experience, it is an essential feature of the present invention that the silicon be treated so as to form a junction for generating electrons by light before the wafer has been reduced to its desired shape. Thereafter, the wafer is formed with the desired shape by using a saw having a diamond blade and cutting through the wafer and the electron generating junction to produce a solar energy cell of at least one dimension smaller than that of the wafer prior to cutting.

While the above constitutes a broad statement of the invention, other features of my invention lie in the type of saw that is utilized to effect the cutting of the silicon wafer. Thus, the saw may be of the rotary blade or oscillating type. Also, the electron generating junction may be of the p-n or n-p type. In any case, there is a substantial and unexpected improvement in the electron generating efficiency of the cell when a diamond saw is used to cut directly through the junction.

The best mode of my invention of which I am aware at this time comprises taking a substantially single crystal ingot of silicon sold by Monsanto Company and cutting it into substantially uniform slices. After slicing by known means, it was found that each sliced, silicon wafer had a uniform thickness of 12 mils and a radius of approximately one inch.

The silicon wafers so produced were treated in a known manner to produce a p-n junction therein. One publication describing such treatment is *Fundamentals of Semiconductor Devices*, Lindmayer and Wrigley, D. Van Nostrand Co., Inc., Princeton, New Jersey, Chapter 4. After the p-n junction had been formed, the approximately 2 inch diameter wafer was cut to the form of a square having sides 0.8 inches by 0.8 inches with a diamond impregnated peripheral saw, blade and saw sold by Lindberg Tempress Company and further identified by Model No. 602. The saw had a rotary blade 0.005 inches thick, having diamond particles embedded therein. The blade was Model No. 12-361.

The speed of rotation of the blade was about 18,000 r.p.m. Utilizing such speed, the wafer was cutting entirely through its thickness, including the p-n junction, to form a rectangular cell 0.8 inches by 0.8 inches at a speed of one inch per second. However, blade speeds of about 5,000 to 20,000 r.p.m. can also be used with success, as were cutting speeds of 0.05 inches to 10 inches per second.

It will be apparent that alterations and modifications of the above-described invention will be obvious to those of skill in this art. I desire that all such alterations and modifications be deemed to fall within the scope of the present invention, the purview of which is to be limited only by the following, appended claims.

I claim:

1. A method of improving the electron generating efficiency of a silicon solar energy cell while forming same from an individual wafer of silicon having at least one dimension larger than the corresponding dimension of the cell, comprising treating the wafer to produce at a surface thereof a junction at which electrons are generated when the surface is exposed to light, and thereafter using a dicing saw having a diamond blade rotating at least at 5,000 r.p.m. and cutting the individual treated wafer at and through said surface junction to form a cell having at least one dimension less than that of said wafer and improved electron generating efficiency when said surface is exposed to light.

2. A method as claimed in claim 1, in which said diamond blade rotates at about 5,000 to 20,000 r.p.m.

3. A method as claimed in claim 1, in which said diamond blade rotates at about 18,000 r.p.m.

4. A method as claimed in claim 1, in which the cutting speed is about 0.05 to 10 inches per second.

5. A method as claimed in claim 1, in which the cutting speed is about 1 inch per second.

6. A silicon solar energy cell formed by the practice of the method of claim 1.

* * * * *